(12) United States Patent
Mandava et al.

(10) Patent No.: US 12,085,632 B2
(45) Date of Patent: Sep. 10, 2024

(54) MRI STREAK-ARTIFACT SUPPRESSION, SYSTEM AND METHOD

(71) Applicant: Arizona Board of Regents on Behalf of the University of Arizona, Tucson, AZ (US)

(72) Inventors: Sagar Mandava, Tucson, AZ (US); Maria I. Altbach, Tucson, AZ (US); Ali Bilgin, Tucson, AZ (US); Diego R. Martin, Tucson, AZ (US); Mahesh Bharath Keerthivasan, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 933 days.

(21) Appl. No.: 17/253,023

(22) PCT Filed: Jun. 19, 2019

(86) PCT No.: PCT/US2019/037933
§ 371 (c)(1),
(2) Date: Dec. 16, 2020

(87) PCT Pub. No.: WO2019/246222
PCT Pub. Date: Dec. 26, 2019

(65) Prior Publication Data
US 2021/0124005 A1    Apr. 29, 2021

Related U.S. Application Data

(60) Provisional application No. 62/687,102, filed on Jun. 19, 2018.

(51) Int. Cl.
*G01N 33/48*    (2006.01)
*G01N 33/50*    (2006.01)
(Continued)

(52) U.S. Cl.
CPC ... *G01R 33/56572* (2013.01); *G01R 33/3415* (2013.01); *G01R 33/3664* (2013.01)

(58) Field of Classification Search
CPC .......... G01R 33/56572; G01R 33/3415; G01R 33/3664
See application file for complete search history.

(56) References Cited

U.S. PATENT DOCUMENTS

2009/0179643 A1   7/2009  Lin
2017/0061589 A1   3/2017  Kuo et al.
2017/0332936 A1  11/2017  Wang et al.

OTHER PUBLICATIONS

Block et al. "Undersampled Radial MRI with Multiple Coils. Iterative Image Reconstruction Using a Total Variation Constraint", Magnetic Resonance in Medicine, vol. 57, pp. 1086-1098.
(Continued)

*Primary Examiner* — Russell S Negin
(74) *Attorney, Agent, or Firm* — Cozen O'Connor

(57) ABSTRACT

A method for producing a streak-suppressed magnetic resonance (MR) image of a subject includes generating an interference covariance matrix $\hat{R}$ front N coil images $I_j$ (x,y), $j=\{1, 2, \ldots, N\}$, each of the N coil images $I_j$ (x,y) corresponding to MR signals detected by a respective one of a phased array of N coils of an MRI scanner. The MR signals originate in voxels of the subject corresponding to an artifact-corrupted region of a coil image. Coordinates (x,y) correspond to a location within a cross-sectional plane of the subject. The method also includes, for subject-regions of cross-sectional plane centered at a respective location (x,y), determining a coil weight vector W (x,y) from $\hat{R}$. The method also includes generating the streak-suppressed MR image as a weighted sum of the coil images $I_j$ (x,y), each weight of the weighted sum being $W_j^*$ (x,y), a $j^{th}$ element of a complex conjugate of coil weight vector W (x,y).

15 Claims, 7 Drawing Sheets

(51) Int. Cl.
    *G01R 33/3415*    (2006.01)
    *G01R 33/36*      (2006.01)
    *G01R 33/565*     (2006.01)

(56)             References Cited

OTHER PUBLICATIONS

Hellstrom et al. (2019) "Extracting Cardiac and Respiratory Self-Gating Signals from Magnetic Resonance Imaging Data," Degree Project, in Medical Engineering, First Level Stockholm, Sweden 2015.
International Search Report and Written Opinion of PCT/US2019/037933 mailed Aug. 22, 2019, 5 pages.

600 ⟶

620
Generate an interference covariance matrix $R$ from $N$ coil images $I_j(x,y)$, $j = \{1, 2, .., N\}$, each of the $N$ coil images $I_j(x,y)$ corresponding to MR signals detected by a respective one of a phased array of $N$ coils of an MRI scanner.

622
Decreasing a condition number of the interference covariance matrix $R$.

630
For each of a plurality of subject-regions of cross-sectional plane centered at a respective location $(x,y)$, determine a coil weight vector $W(x,y)$.

632
For each of a plurality of subject-regions of cross-sectional plane centered at a respective location $(x,y)$: Generate a signal correlation matrix $\hat{S}^{(x,y)}$ of the subject-region from the $N$ coil images $I_j(x,y)$ corresponding to MR signals originating in a second plurality of voxels corresponding to the subject-region.

636
Determine coil weight vector $W(x,y)$ equal to a product of the inverse of covariance matrix $R$ and a coil sensitivity vector.

634
Determine coil weight vector $W(x,y)$ equal to an eigenvector of a matrix product $R^{-1}\hat{S}(x,y)$.

640
Generate the streak-suppressed MR image as a weighted sum of the coil images $I_j(x,y)$, each weight of the weighted sum being $W_j^*(x,y)$, a $j^{th}$ element of a complex conjugate of coil weight vector $W(x,y)$

FIG. 6

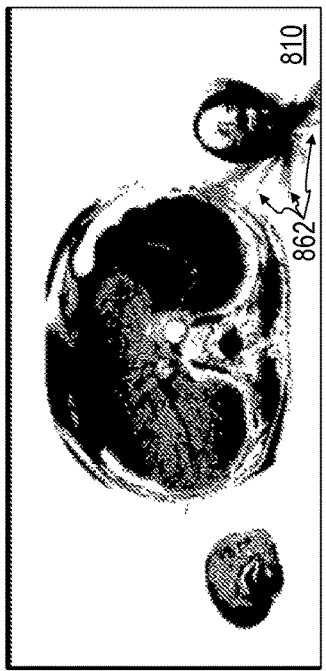
FIG. 8
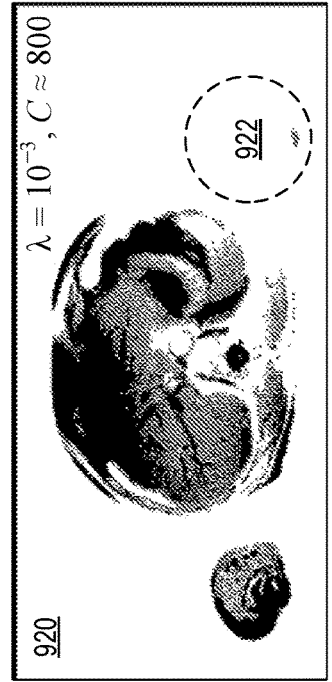
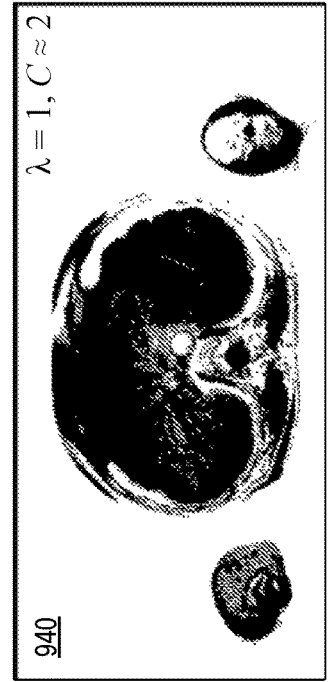
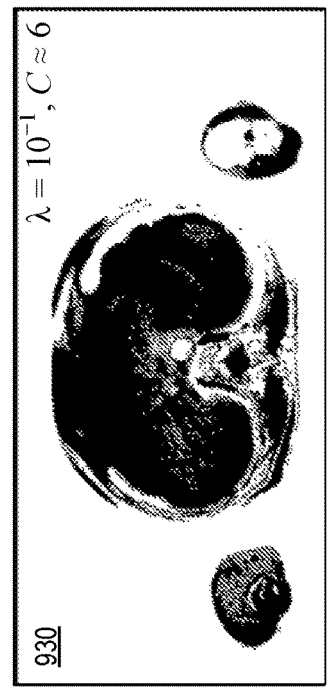
FIG. 9

MRI STREAK-ARTIFACT SUPPRESSION, SYSTEM AND METHOD

CROSS-REFERENCE TO RELATED APPLICATIONS

This application claims priority to PCT application number PCT/US19/37933 filed Jun. 19, 2019 and U.S. provisional patent application Ser. No. 62/687,102, filed on Jun. 19, 2018. The disclosure of which each application is incorporated herein by reference in its entirety.

BACKGROUND

Radial k-space scanning is becoming increasingly popular for abdominal magnetic resonance imaging (MRI) due to its reduced sensitivity to motion and its potential for supporting accelerated imaging. Abdominal MRI is challenging due to its strong susceptibility to voluntary and involuntary motion. This makes radial imaging particularly attractive for abdominal applications. However, when imaging objects with a large field of view, streaking artifacts due to gradient nonlinearities corrupt images even when Nyquist sampling requirements are satisfied. In the abdomen, common sources of streaks are unsuppressed fat, such as fat present in an imaged subject's arms. For example, FIG. 1 is an abdominal MR image 160 that includes streak artifacts 162 originating in a region 164, which corresponds to a subject's right arm. MR image 160 is inverted such that dark regions correspond to strong MR signal strength. FIG. 1 denotes selected artifact regions 165 of MR image 160 that include one or more streak artifacts 162. FIG. 1 includes a coordinate system 198 that defines orthogonal axes x, y, and z. Herein, reference to an axis x, y, or z or associated direction ±x, ±y, or ±z refers to coordinate system 198.

Due to the narrow confines of many MRI main magnets, the arms of the person being imaged are typically positioned near the edge of the magnet where the magnetic field gradients tend to be more nonlinear than in a center of the magnet. Such non-linear gradients increase likelihood of streak artifacts.

If the level of streaking is mild, radiologists can easily read through the artifacts. Strong streaking artifacts can lead to unacceptable loss in image quality and, in some cases, can obscure pathology. Prior coil removal methods prune coils contributing the most to streaking artifacts at the expense of signal loss.

In practice, a subset of coils in a phased array of coils of an MR scanner contribute the majority of the streaking artifacts. One strategy to mitigate these artifacts involves identifying the problematic coils and discarding the data from them prior to coil combination. Manual identification of problematic coils can be quite laborious as trading artifact reduction vs. signal-to-noise ratio (SNR) loss is non-trivial. Other strategies can lead to undesired loss of SNR when coils are pruned or down-weighted heavily to minimize artifacts.

SUMMARY OF THE EMBODIMENTS

In a first aspect, a method for producing a streak-suppressed magnetic resonance (MR) image of a subject is disclosed. The method includes generating an interference covariance matrix $\hat{R}$ from N coil images $I_j(x,y)$, $j=\{1, 2, \ldots, N\}$, each of the N coil images $I_j(x,y)$ corresponding to MR signals detected by a respective one of a phased array of N coils of an MRI scanner. The MR signals originate in a first plurality of voxels of the subject corresponding to an artifact-region of a coil image corrupted by an artifact. Coordinates (x,y) correspond to a location within a cross-sectional plane of the subject. The method also includes, for each of a plurality of subject-regions of cross-sectional plane centered at a respective location (x,y), determining a coil weight vector $\overline{W}(x,y)$ from the interference covariance matrix $\hat{R}$. The method also includes generating the streak-suppressed MR image as a weighted sum of the coil images $I_j(x,y)$, each weight of the weighted sum being $W^*_j(x,y)$, a $j^{th}$ element of a complex conjugate of coil weight vector $\overline{W}(x,y)$.

In a second aspect, a streak-artifact suppressor for producing a streak-suppressed MR image of a subject includes a processor and a memory. The memory stores machine-readable instructions that, when executed by the processor, control the processor to execute the method the first aspect.

BRIEF DESCRIPTION OF THE FIGURES

FIG. 6 is a flowchart illustrating a method for producing a streak-suppressed magnetic resonance image of a subject, in embodiments.

FIG. 8 is an abdominal MR image processed with an adaptive coil combination method for noise reduction.

FIG. 9 includes abdominal MR images, generated via the method of FIG. 6 with different regularization parameters of the interference covariance matrix thereof, in embodiments.

DETAILED DESCRIPTION OF THE EMBODIMENTS

Nuclear magnetic resonance occurs when nuclei having an odd number of nucleons, such as hydrogen $H^1$, are exposed simultaneously to a magnetic field sufficiently strong to align the magnetic moment of these nuclei due to spins of the nucleons, and to electromagnetic radiation at a specific magnetic-field-dependent frequency. At this specific frequency, energy may be absorbed from the electromagnetic field or energy may be re-radiated after stimulus with the electromagnetic field. The electromagnetic field is typically in the VHF to UHF radio frequency bands.

Figure 2:
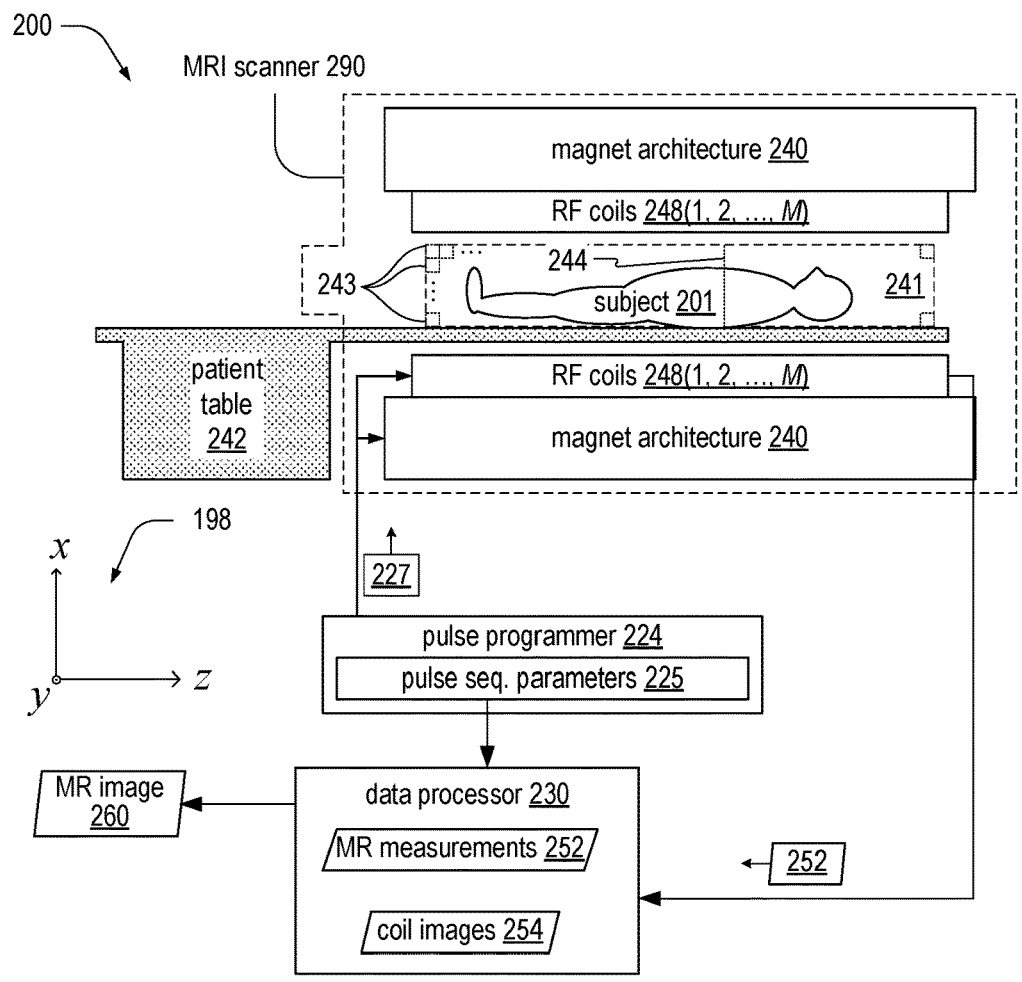
FIG. 2 is a functional block diagram of one MRI system, in embodiments.

FIG. 2 is a functional block diagram of one example magnetic resonance imaging (MRI) system 200 for forming an MR image 260 of a subject 201. MRI system 200 includes an MRI scanner 290 and utilizes a pulse sequence configurable to minimize or reduce phase error in MR image 260. MRI scanner 290 includes a magnet architecture 240 and a plurality of RF coils 248 (1, . . . , M). MRI system 200 may include at least one phased array coil, each including a plurality of coils 248. In embodiments, the phased array coil includes between twenty and forty coils, each functioning as a respective channel Subject 201 lies on a patient table 242 such that at least a part of subject 201 is within an imaging volume 241 that is subdivided into a plurality of voxels 243. For clarity of illustration, not all voxels 243 of imaging volume 241 are shown in FIG. 2. RF coils 248 function as receiver channels of MR signals generated within the portion of subject 201 located within imaging volume 241.

Figure 1:
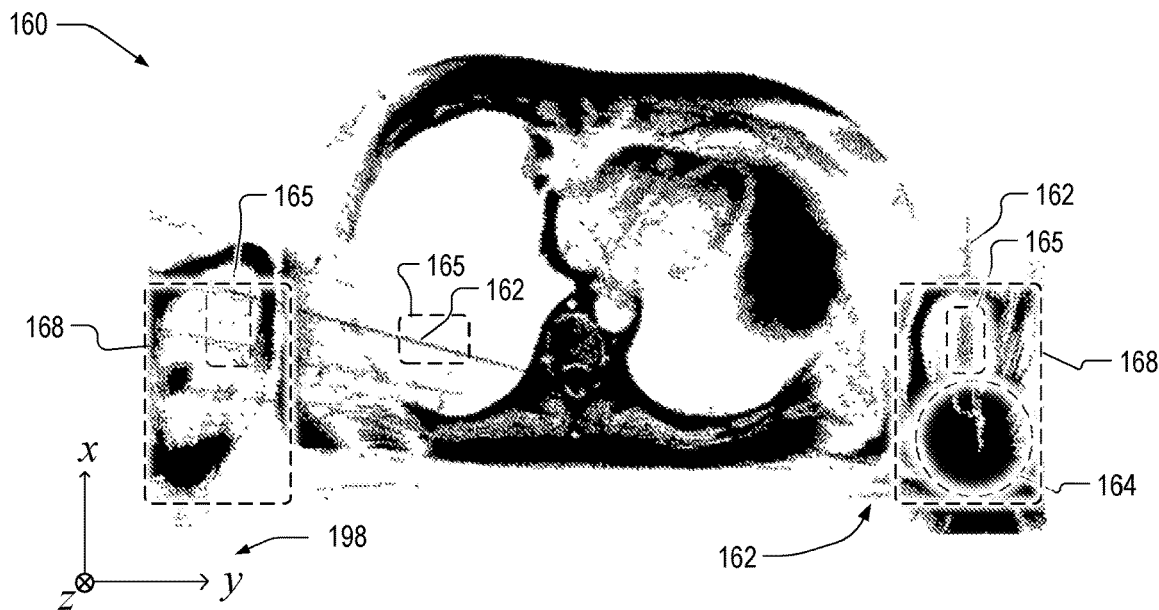
FIG. 1 is an example MR image that includes streaking artifacts.

Transverse and sagittal planes intersecting subject 201 are parallel to the x-y plane and the x-z plane, respectively. Imaging volume 241 includes a transverse plane 244, which is a representative plane corresponding to the plane of MR image 160, FIG. 1. Transverse plane 244 intersects a plurality of voxels 243 that include sources of streak artifacts 162.

RF coils 248 may be transceivers that function as antennae capable of both (a) transmitting an RF signal to excite protons in imaging volume 241 and (b) receiving MR signals from excited protons. In embodiments, MRI scanner 290 includes dedicated transmitter coils for transmitting RF signals, such that RF coils 248 operate as receiver coils only.

In embodiments, each RF coil 248 functions as a separate receiver channel of MRI system 200, and is accordingly and interchangeably referred to as receiver coil 248, receiver channel 248, or channel 248. Each RF coil 248 may be at least one of a surface coil, a paired saddle coil, a bird cage coil, a Helmholtz coil pair, and other coil types known in the art.

MRI system 200 also includes a data processor 230 and a pulse programmer 224. Pulse programmer 224 applies a pulse sequence 227 to RF coils 248 and magnet architecture 240. Pulse programmer 224 includes pulse sequence parameters 225 that, at least in part, define pulse sequence 227. Pulse sequence parameters 225 may be stored to memory within pulse programmer 224. Pulse programmer 224 determines an RF signal to be transmitted by RF coils 248 (or, alternatively, dedicated transmitter coils) according to pulse sequence parameters 225. RF coils 248 transmit this RF signal to imaging volume 241 so as to excite nuclear magnetic resonances of protons in subject 201. The excited protons emit MR signals that are detected by RF coils 248. RF coils 248 may include coils in orthogonal planes such that they make in-phase (real) and quadrature (imaginary) measurements of MR signals.

Pulse sequence parameters 225 relevant to controlling RF coils 248 may include repetition time between RF pulses emitted by RF coils 248. Magnet architecture 240 produces a magnetic field at subject 201. Pulse sequence parameters 225 include parameters that define gradients of this magnetic field such as echo times. Data processor 230 receives MR signals detected by RF coils 248 as MR measurements 252. Data processor 230 includes software that reconstructs a plurality of coil images 254 from MR measurements 252 and produces MR image 260 therefrom.

Figure 3:
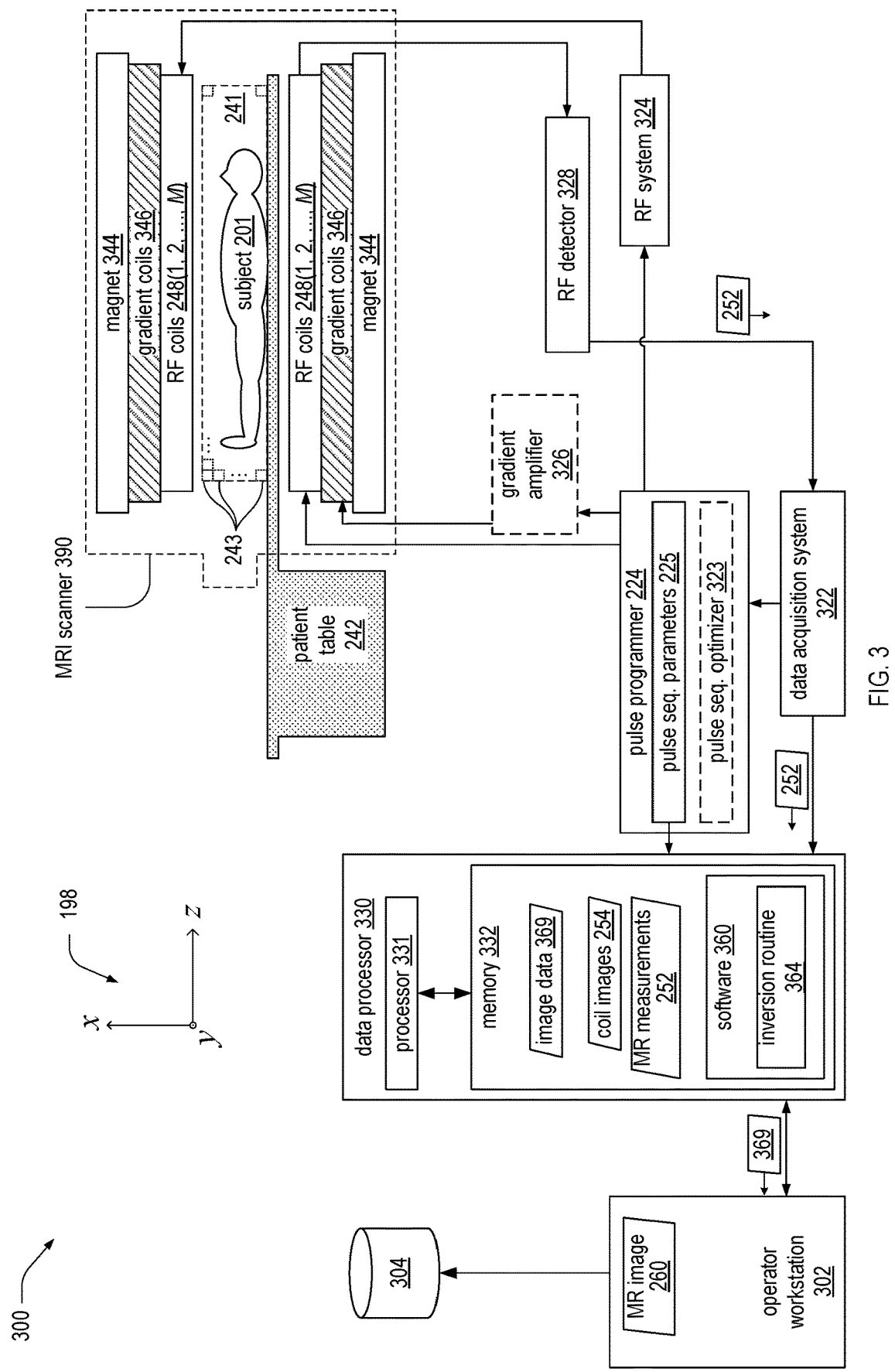
FIG. 3 is a functional block diagram of another MRI system, which is an embodiment of the MRI system of FIG. 2.

FIG. 3 is a functional block diagram of an MRI system 300 that forms MR image 260 of subject 201. MRI system 300 is an example of MRI system 200 and includes MRI scanner 390 and data processor 330, which are respective examples of MRI scanner 290 and data processor 230, FIG. 2. MRI system 300 implements magnet architecture 240 as a magnet 344 and gradient coils 346.

Data processor 330 includes a processor 331 and a memory 332, which stores software 360, MR measurements 252, and coil images 254. Memory 332 may be transitory and/or non-transitory and may include one or both of volatile memory (e.g., SRAM, DRAM, computational RAM, other volatile memory, or any combination thereof) and non-volatile memory (e.g., FLASH, ROM, magnetic media, optical media, other non-volatile memory, or any combination thereof). Part or all of memory 332 may be integrated into data processor 330.

In embodiments, MRI system 300 includes at least one of an operator workstation 302, a data storage unit 304, a data acquisition system 322, an RF system 324, and RF detector 328. MRI system 300 may further include a gradient amplifier 326. In embodiments, pulse programmer 224 includes a pulse sequence optimizer 323 for optimizing pulse sequence parameters 225 for a given type of MR measurement. RF system 324 generates RF signals for RF coils 248 according to pulse sequence parameters 225. RF system 324 may include an RF source and an RF amplifier.

In MRI scanner 390, magnet 344 produces a primary (or main) magnetic field parallel to the z-axis. Gradient coils 346 are capable of producing three orthogonal gradient fields capable of distorting the primary magnetic field in one or more directions spanned by axes x, y, and z. The gradient field is determined by pulse programmer 224, which is electrically coupled to gradient coils 346, optionally via gradient amplifier 326. Pulse programmer 224, and pulse sequence parameters 225 therein, determine the gradient fields' spatial distribution and amplitude. Pulse sequence parameters 225 relevant to controlling gradient coils 346 may include velocity-encoding gradient parameters and motion-encoding gradient parameters. Gradient amplifier 326 enables gradient coils 346 to produce sufficiently strong gradient fields to enable capture of MR images.

RF detector 328 detects MR signals received by RF coils 248 and transmits them as MR measurements 252 to data processor 330 via data acquisition system 322. In some modes of operation, data acquisition system 322 may feedback at least a portion of MR measurements 252 to pulse programmer 224 such that pulse programmer 224 may adjust gradient fields and transmitted RF signals in response to previous MR measurements.

Software 360 may include an inversion routine 364. When coil images 254 are k-space images, e.g., in the spatial-frequency domain, inversion routine 364 inverts coil images 254, via a Fourier transform or its inverse, for example, to recover magnitude and/or phase parameters for each voxel 243. The recovered magnitude and phase voxels for each channel are then processed to yield image data 369.

In embodiments, data processor 330 outputs MR image data 369 to operator workstation 302, which displays MR image data 369 as MR image 260. MR image data 369 may be phase-image data. Operator workstation 302 may save MR image data 369 to data storage unit 304. Data storage unit 304 may be part of operator workstation 302.

Figure 4:
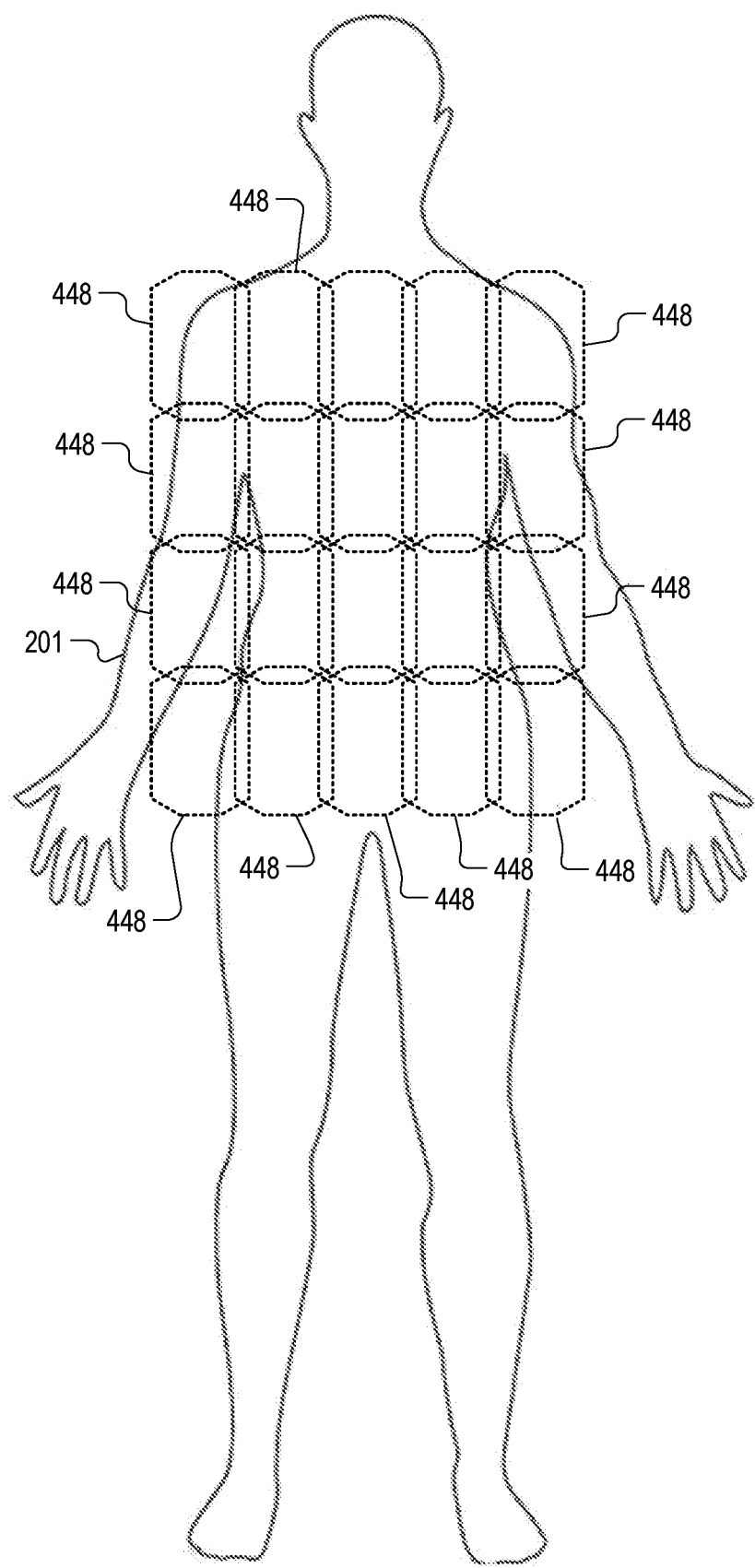
FIG. 4 is an illustration of candidate coil positions used for the MRI systems of FIGS. 2 and 3, in embodiments.

FIG. 4 is a schematic plan view of subject 401 with a plurality of coil positions 448 superimposed thereon. In embodiments, each coil position 448 corresponds to a location of a respective RF coil 248. For clarity of illustration, not all coil positions 448 are enumerated in FIG. 4.

Embodiments disclosed herein reduce streaking artifacts based on phased array beamforming. Beamforming is a form of spatial filtering where data acquired using an array of sensors (similar to the phased arrays in MRI) can be used to suppress unwanted signals in MRI applications. Embodiments disclosed herein include a method for streak-artifact reduction that uses image samples containing streak artifacts to generate a noise (interference) covariance matrix. The image samples may correspond to a predetermined location, such as where streak artifacts often occur for a given type of MR image. For example, for a transverse abdominal MR image similar to MR image 160, the predetermined location may correspond to cross-sections of the subject's arms, designated as predetermined regions 168 in FIG. 1.

Signal samples from RF coils 248 coils, imaging a spatial region of transverse plane 244 that is corrupted by artifact, are extracted and an interference covariance matrix $\hat{R}$ is estimated as:

$$\hat{R}(j,k) = c_1 \frac{1}{(Q_R - 1)} \cdot \sum_{(x_c, y_c) \in SSR} I_j(x_c, y_c) I_k^*(x_c, y_c), \quad (1)$$

where spatial support region SSR is the spatial region, such as an artifact region 165, (with $Q_R$ voxels) containing streak artifacts. Equation (1) includes a proportionality constant $c_1$, which equals one in embodiments. In Eq. (1), $I_j$ denotes the coil image for the $j^{th}$ coil, $I_k$ denotes the coil image for the $k^{th}$ coil and superscript * denotes complex conjugation. For a phased array with N coils, index $j = \{1, 2, \ldots, N\}$ and index $k = \{1, 2, \ldots, N\}$.

For a N-dimensional coil array, an N×N signal correlation matrix at spatial location (x,y) is defined as follows:

$$\hat{S}^{(x,y)}(j,k) = c_2 \frac{1}{(Q_S - 1)} \cdot \sum_{(x_c, y_c) \in ROI} I_j(x_c, y_c) I_k^*(x_c, y_c), \quad (2)$$

where ROI is a spatial region centered at pixel (x,y) over which the correlation matrix is estimated. Pixel (x,y) refers to pixel of an MR image with streak artifacts, such as MR image 160, at location (x,y). Equation (2) includes a proportionality constant $c_2$, which equals $c_1$ in embodiments. $Q_S$ is the number of spatial samples within ROI. In embodiments, signal correlation matrix $\hat{S}^{(x,y)}$ is spatially varying while interference covariance matrix $\hat{R}$ is not.

To avoid signal loss due to destructive interference, the interference samples may be extracted from background regions with pure streaking artifact. In applications where streaking artifact sources are outside the region of interest ROI, such as in region 168, the spatial support region SSR can include the streaking artifact source itself.

In embodiments, a coil weight vector at spatial location (x,y) is defined as:

$$\overline{W}(x,y) = F(\hat{R}^{-1}\hat{S}^{(x,y)}), \quad (3a)$$

where F(•) is an operator that extracts an N-element eigenvector of the N×N matrix input. The extracted eigenvector may be a dominant eigenvector. In embodiments, coil weight vector is determined by equation (3b), where $\overline{b}$ is a coil sensitivity vector.

$$\overline{W}(x,y) = \hat{R}^{-1}\overline{b}(x,y), \quad (3b)$$

Herein, $W_j(x,y)$, referred to herein as a coil combination map, is a $j^{th}$ element of a complex conjugate of coil weight vector $\overline{W}(x,y)$, and $W_j^*(x,y)$ is its complex conjugate. Repeating this process at each spatial location (x,y) allows the generation of the coil combination maps ($W_j(x,y)$) for the entire image. In embodiments, coil images $I_j$ are then combined as a weighted sum to yield a streak-suppressed MR image I(x,y) defined in Eq. (4):

$$I(x,y) = \sum_{j=1}^{N} W_j^*(x,y) I_j(x,y) \quad (4)$$

In practice, the condition number of $\hat{R}$ can be quite large leading to large errors in the computation of its inverse (in Eqs. (3a), (3b)). A diagonal-loading approach to improve the condition number is to regularize the interference covariance matrix as follows:

$$\hat{R}_l = \hat{R} + \lambda I, \quad (5)$$

where $\lambda$ is the regularization parameter and $I \in \mathbb{C}^{N \times N}$ is the identity matrix. In embodiments, regularization parameter $\lambda$ is selected to yield low condition numbers and our experiments suggest that there is a wide range over which it yields very similar results. In embodiments, a range of regularization parameter $\lambda$ that yields acceptable results is 0.1 to 1.0. Regularization parameter $\lambda$ may also be used to trade-off streak suppression and signal retention.

In embodiments, the disclosed method of generating streak-suppressed MR image I(x,y) uses interference correlation across all N coils to suppress artifact. In practice, this approach may be insufficient when dealing with multi-source streaking. For instance, when both arms of subject 201 create streaking artifacts, the process leading to streak-suppressed MR image I(x,y) (equation (4)) may perform well in removing streaks from only one arm. To address this, the N-dimensional coil array may be partitioned into multiple sets based on the dominant streaking source. For M partitions, with each partition containing $N_m$ coils ($M \cdot N_m = N$), a respective interference covariance matrix $\hat{R}_m$, $m = \{1, 2, \ldots, M\}$ is computed per Eq. (1) and used in Eq. (3a) or (3b) to create respective partition-specific coil combination maps $W_{m,j}(x,y)$. Each interference covariance matrix $\hat{R}_m$ has dimensions $N_m \times N_m$. In equation (3b), coil sensitivity vector $\overline{b}(x,y)$ may be replaced with a coil sensitivity sub-vector $\overline{b}_m(x,y)$, which has $N_m$ elements.

The partition-specific coil combination maps are used with the associated coil images and a weighted linear combination is used to generate the streak-suppressed MR image. In embodiments, streak-suppressed MR image I(x,y) is found according to Eq. (6):

$$I(x,y) = \sum_{m=1}^{M} \sum_{j=1}^{N_M} W_{m,j}^*(x,y) I_j(x,y) \quad (6)$$

Equation 6 may be used when M<<N, e.g., N>10M, as the streak-artifact suppression depends on exploiting channel correlations.

Figure 5:
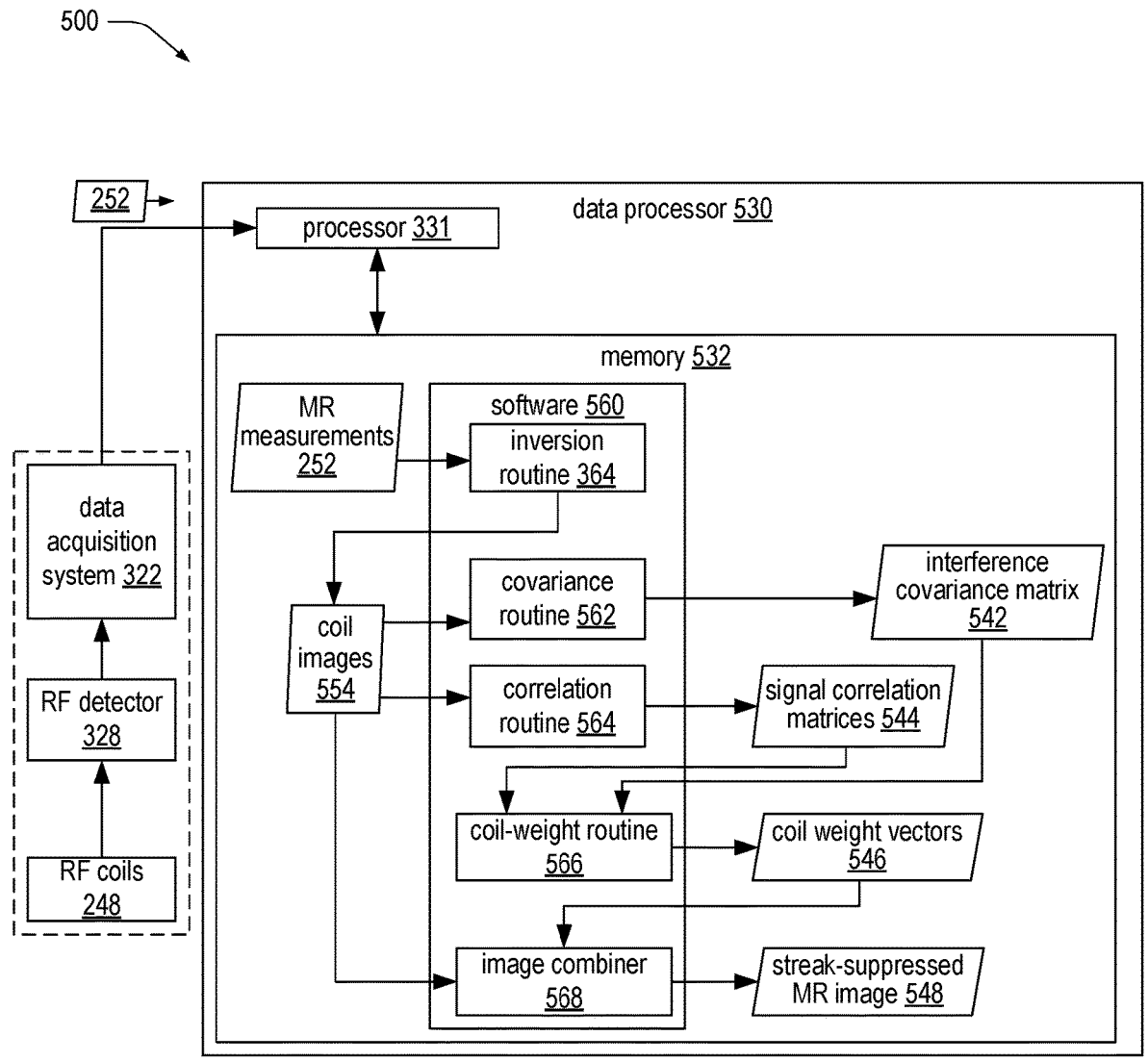
FIG. 5 is a schematic of a streak-artifact suppressor for producing a streak-suppressed magnetic resonance (MR) image of a subject, in embodiments.

FIG. 5 is a schematic of a streak-artifact suppressor 500 for producing a streak-suppressed MR image 548 of a subject. Streak-artifact suppressor 500 includes a data processor 530 and, in embodiments, at least one of RF coils 248, RF detector 328, and data acquisition system 322. Data processor 530 is an example of data processor 230 and includes processor 331 and a memory 532 communicatively coupled thereto, which stores software 560. Memory 532 and software 560 are examples of memory 332 and software 360, respectively.

Software 560 includes at least one of inversion routine 364, a covariance routine 562, a correlation routine 564, a coil-weight routine 566, and an image combiner 568, which output, respectively, coil images 554, an interference covariance matrix 542, signal correlation matrices 544, coil weight vectors 546, and a streak-suppressed MR image 548. In embodiments, Eqs. (1)-(4) are respective mathematical expressions for interference covariance matrix 542, signal correlation matrices 544, coil weight vectors 546, and a streak-suppressed MR image 548.

FIG. 6 is a flowchart illustrating a method 600 for producing a streak-suppressed magnetic resonance image of a subject. Method 600 may be implemented within one or more aspects of streak-artifact suppressor 500. In embodiments, method 600 is implemented by processor 331 executing computer-readable instructions of software 560. Method 600 includes steps 620, 630, and 640.

Step 620 includes generating an interference covariance matrix $\hat{R}$ from N coil images $I_j(x,y)$, $j=\{1, 2, \ldots, N\}$. Each of the N coil images $I_j(x,y)$ corresponds to MR signals detected by a respective one of a phased array of N coils of an MRI scanner. The MR signals originate in a first plurality of voxels of the subject correspond to one or more artifact-regions of a coil image corrupted by an artifact. Coordinates (x,y) correspond to a location within a cross-sectional plane of the subject. In embodiments, the total number of voxels of the first plurality of voxels is $Q_R$, and each matrix element $\hat{R}(j,k)$ of interference covariance matrix $\hat{R}$ is given by Eq. (1) above. The one or more artifact-regions may be determined prior to capturing coil images, as predetermined regions 168 for example, as previously discussed.

In an example of step 620, coordinates (x, y) are in transverse plane 244 intersecting imaging volume 241, FIG. 2, the first plurality of voxels include multiple voxels 243 that include one or more artifact regions 165, and covariance routine 562 of streak-artifact suppressor 500 generates interference covariance matrix 542 from coil images 554.

Step 620 may include step 622, which includes decreasing a condition number of interference covariance matrix $\hat{R}$. In an example of step 622, covariance routine 562 includes a conditioning routine, and decreases a condition number of interference covariance matrix 542 per Eq. (5) above.

Step 630 includes, for each of a plurality of subject-regions of a cross-sectional plane centered at a respective location (x,y), determining a coil weight vector $\overline{W}(x,y)$. In embodiments, step 630 includes steps 632 and 634. In embodiments, such as those lacking steps 632 and 634, step 630 includes step 636.

Step 632 includes, for each of a plurality of subject-regions of a cross-sectional plane centered at a respective location (x,y), generating a signal correlation matrix $\hat{S}^{(x,y)}$ of the subject-region from the N coil images $I_j(x,y)$ corresponding to MR signals originating in a second plurality of voxels corresponding to the subject-region. In an example of step 632, the second plurality of voxels includes multiple voxels 243 in transverse plane 244, and correlation routine 564 generates, from coil images 554, a plurality of signal correlation matrices 544 each corresponding to a respective one of the plurality of subject-regions. In embodiments, the total number of voxels of the second plurality of voxels is $Q_s$, and each matrix element $\hat{S}^{(x,y)}(j, k)$ of signal correlation matrix $\hat{S}^{(x,y)}$ is given by Eq. (2) above.

Step 634 includes determining coil weight vector $\overline{W}(x, y)$ per equation (3a). In an example of step 634, coil-weight routine 566 determines, via Eq. (3a), a plurality of coil weight vectors 546 each corresponding to a respective one of the plurality of subject-regions.

Step 636 includes determining coil weight vector $\overline{W}(x, y)$ per equation (3b). In an example of step 634, coil-weight routine 566 determines, via Eq. (3b), a plurality of coil weight vectors 546 each corresponding to a respective one of the plurality of subject-regions.

Step 640 includes generating the streak-suppressed MR image as a weighted sum of the N coil images $I_j(x, y)$. Each weight of the weighted sum is $W^*_j(x, y)$, which is a $j^{th}$ element of a complex conjugate of coil weight vector $\overline{W}(x, y)$. In an example of step 640, image combiner 568 generates, via Eq. (4), streak-suppressed MR image 548 from coil images 554 and coil weight vectors 546.

Figure 7:
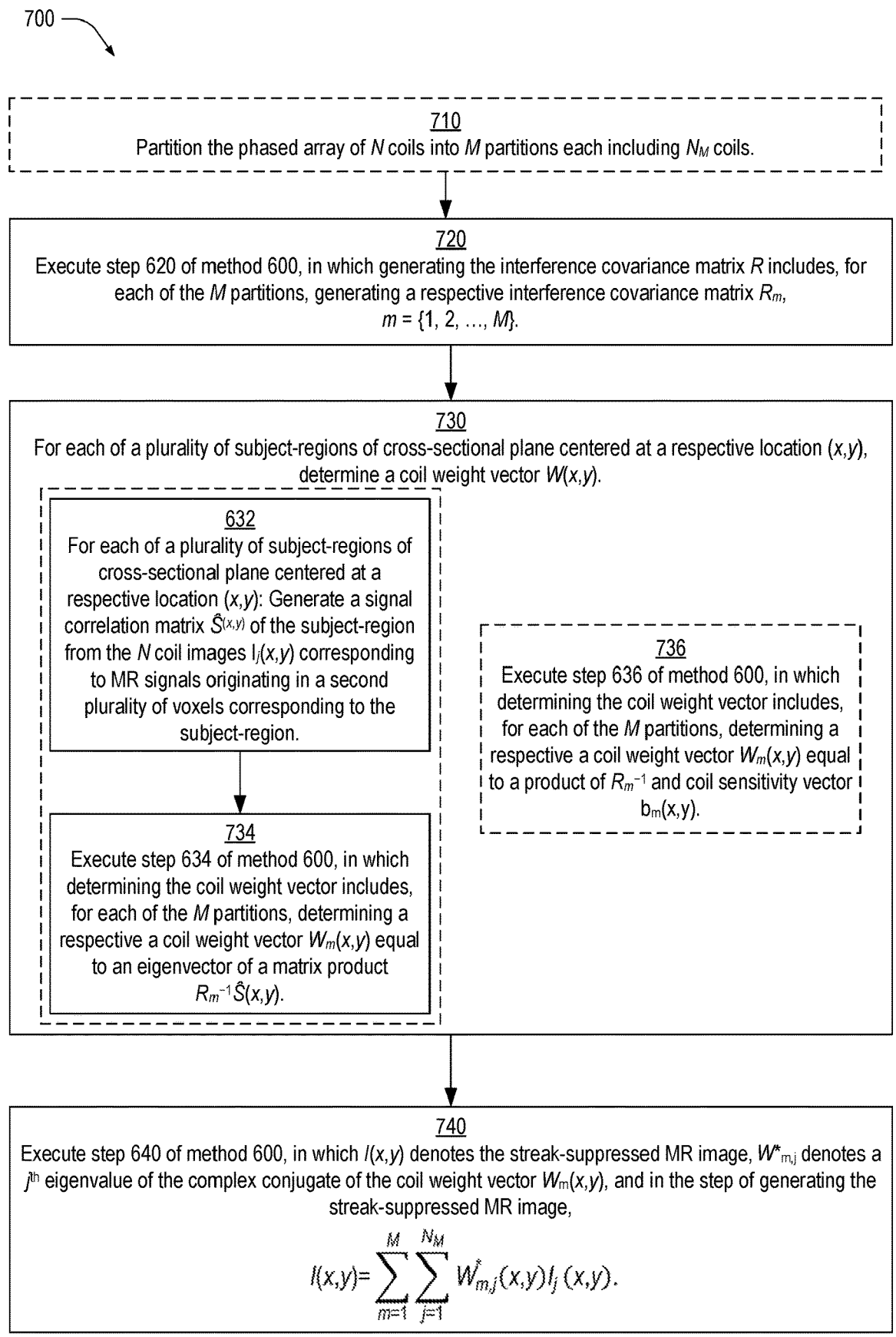
FIG. 7 is a flowchart illustrating an example of the method of FIG. 6, in embodiments.

FIG. 7 is a flowchart illustrating a method 700, which is an example of method 600, FIG. 6, when the phased array of N coils includes M partitions of $N_M$ coils. Method 700 may be implemented within one or more aspects of streak-artifact suppressor 500. In embodiments, method 700 is implemented by processor 331 executing computer-readable instructions of software 560. Method 700 includes steps 720, 730, and 740. In embodiments, method 700 also includes step 710, which includes partitioning the phased array of N coils into M partitions each including $N_M$ coils. In embodiments, each of the M partitions include the same number of coils. In embodiments, a first partition and a second partition of the M partitions have $N_1$ coils and $N_2$ coils, respectively, where $N_2 \neq N_1$.

Step 720 includes executing step 620, in which generating the interference covariance matrix $\hat{R}$ includes, for each of M partitions of the phased array of N coils, generating a respective interference covariance matrix $\hat{R}_m$, $m=\{1, 2, \ldots, M\}$. In an example of step 720, covariance routine 562 generates, for each of M partitions of coil images 554, a respective interference covariance matrix 542.

Step 730 is analogous to step 630 of method 600 and includes, for each of a plurality of subject-regions of a cross-sectional plane centered at a respective location (x,y), determining a coil weight vector $\overline{W}(x,y)$. In embodiments, step 730 includes steps 632 and 734. In embodiments, such as those lacking steps 632 and 734, step 730 includes step 736.

Step 734 includes executing step 634, in which determining the coil weight vector includes, for each of the M partitions, determining a respective a coil weight vector $\overline{W}_m(x,y)$ equal to an eigenvector of a matrix product $\hat{R}_m^{-1}\hat{S}^{(x,y)}$. In an example of step 734, coil-weight routine 566 determines, via Eq. (3a) with $\hat{R}_m^{-1}$ replacing $\hat{R}^{-1}$, and for each of the M partitions m=1–M, a respective plurality of coil weight vectors 546 each corresponding to a respective one of the plurality of subject-regions.

Step 736 incudes executing step 636, in which determining coil weight vector includes, for each of the M partitions, determining a respective a coil weight vector $\overline{W}_m(x,y)$ equal to $\hat{R}_m^{-1}\overline{b}(x,y)$ per equation (3b) with $\hat{R}_m^{-1}$ replacing $\hat{R}^{-1}$ and $\overline{b}_m(x,y)$ replacing $\overline{b}(x,y)$. In an example of step 734, coil-weight routine 566 determines, via Eq. (3b) with $\hat{R}_m^{-1}$ replacing $\hat{R}^{-1}$ and $\overline{b}_m(x,y)$ replacing $\overline{b}(x,y)$, and for each of the M partitions m=1–M, a plurality of coil weight vectors 546 each corresponding to a respective one of the plurality of subject-regions.

Step 740 includes executing step 640, in which I(x,y) denotes the streak-suppressed MR image, $W^*_{m,j}$ denotes a $j^{th}$ eigenvalue of the complex conjugate of the coil weight vector $\overline{W}_m(x,y)$, and in the step of generating the streak-suppressed MR image, I(x,y) is given by Eq. (6). In an example of step 740, image combiner 568 generates, via Eq. (6), streak-suppressed MR image 548 from (a) coil images 554 and (b) coil weight vectors 546 determined in step 740.

FIG. 8 is a binary and inverted abdominal MR image 810 processed with an adaptive coil combination method for noise reduction, as described by Walsh et al., *Magn. Reson. Med.*, 43: 682-690, (2000). Abdominal MR image 810 is similar to MR image 160 and includes streak artifacts 862, which are similar in origin to streak artifacts 162.

FIG. 9 includes abdominal MR images 910, 920, 930, and 940, each of which are examples of streak-suppressed MR image 548 generated with different regularization parameters λ per Eq. (5) and resultant condition numbers C. Images 910-940 illustrate tradeoffs between artifact reduction and signal retention when method 600 includes the conditioning of step 622. While abdominal MR images 910 and 920 lack streak artifacts, signal levels are significantly suppressed, as illustrated by the absence or near-absence of MR signals from the imaged subject's right arm in respective regions 912 and 922 of abdominal MR images 910 and 920. Regularization parameters λ used to generate abdominal MR images 930 and 940 result in adequately removed streak artifacts without losing significant signal.

Combinations of Features

Features described above as well as those claimed below may be combined in various ways without departing from the scope hereof. The following enumerated examples illustrate some possible, non-limiting combinations:

(A1) A method for producing a streak-suppressed magnetic resonance (MR) image of a subject includes generating an interference covariance matrix $\hat{R}$ from N coil images $I_j(x, y)$, $j=\{1, 2, \ldots, N\}$, each of the N coil images $I_j(x, y)$ corresponding to MR signals detected by a respective one of a phased array of N coils of an MRI scanner, the MR signals originating in a first plurality of voxels of the subject corresponding to artifact-region of a coil image corrupted by an artifact, coordinates (x, y) corresponding to a location within a cross-sectional plane of the subject. The method also includes, for each of a plurality of subject-regions of cross-sectional plane centered at a respective location (x, y), determining a coil weight vector $\overline{W}(x, y)$ from the interference covariance matrix $\hat{R}$. The method also includes generating the streak-suppressed MR image as a weighted sum of the N coil images $I_j(x, y)$, each weight of the weighted sum being $W^*_j(x, y)$, a $j^{th}$ element of a complex conjugate of coil weight vector $\overline{W}(x, y)$.

(A2) In any method (A1), the first plurality of voxels being $Q_R$ in number, and, in the step of generating the interference covariance matrix, the interference covariance matrix $\hat{R}$ is an N×N matrix, each matrix element $\hat{R}(j, k)$ may be proportional to $$\frac{1}{(Q_R - 1)} \cdot \sum_{(x_c, y_c)} I_j(x_c, y_c) I_k^*(x_c, y_c),$$

where summation Σ is over respective ranges of coordinates $x_c$ and $y_c$ corresponding to the first plurality of voxels, where $I^*_k$ denotes the complex conjugate of a coil image corresponding to the $k^{th}$ one of the N coils.

(A3) In any of methods (A1) and (A2), the second plurality of voxels is $Q_s$ in number, and, in the step of generating the signal correlation matrix $\hat{S}^{(x,y)}$, the signal correlation matrix $\hat{S}$ is an N×N matrix, a matrix element $\hat{S}^{(x,y)}(j, k)$ may be proportional to $$\frac{1}{(Q_S - 1)} \cdot \sum_{(x_c, y_c)} I_j(x_c, y_c) I_k^*(x_c, y_c),$$

where summation Σ is over respective ranges of coordinates $x_c$ and $y_c$ corresponding to the second plurality of voxels centered at voxel coordinate (x, y), where $I^*_k$ denotes the complex conjugate of a coil image corresponding to the $k^{th}$ one of the N coils.

(A4) In any of methods (A1) through (A3), I(x,y) denoting the streak-suppressed MR image, and in the step of generating the streak-suppressed MR image, I(x,y) may be equal to $\sum_{j=1}^{N} W^*_j(x,y) I_j(x,y)$.

(A5) Any of methods (A1) through (A4) may further include, before determining the coil weight vector $\overline{W}(x,y)$ for at least one of the plurality of subject-regions, decreasing a condition number of the interference covariance matrix $\hat{R}$.

(A6) In any of method (A5), the interference covariance matrix $\hat{R}$ is an N×N matrix, decreasing the condition number may include regularizing the interference covariance matrix $\hat{R}$ by adding thereto an N×N identity matrix multiplied by a scalar.

(A7) Any of methods (A1) through (A6) may further include (a) generating a signal correlation matrix $\hat{S}^{(x,y)}$ of the subject-region from the N coil images $I_j(x,y)$ corresponding to MR signals originating in a second plurality of voxels corresponding to the subject-region, and (b) determining a coil weight vector $\overline{W}(x,y)$ equal to an eigenvector of a matrix product $\hat{R}^{-1}\hat{S}^{(x,y)}$.

(A8) In any of methods (A1) through (A7), the phased array of N coils including M partitions of $N_M$ coils: (a) the step of generating the interference covariance matrix $\hat{R}$ may include, for each of M partitions of the phased array of N coils, generating a respective interference covariance matrix $\hat{R}_m$, $m=\{1, 2, \ldots, M\}$; (b) the step of determining the coil weight vector may include, for each of the M partitions, determining a respective a coil weight vector $\overline{W}_m(x,y)$ from the respective interference covariance matrix $\hat{R}_m$; and (c) in the step of generating the streak-suppressed MR image, I(x,y) denoting the streak-suppressed MR image, $W^*_{m,j}$ denoting a $j^{th}$ eigenvalue of the complex conjugate of the coil weight vector $\overline{W}_m(x,y)$, and in the step of generating the streak-suppressed MR image, I(x,y) may equal $\sum_{m=1}^{M} \sum_{j=1}^{N_M} W^*_{m,j}(x,y) I_j(x,y)$.

(B1) A streak-artifact suppressor for producing a streak-suppressed MR image of a subject includes a processor and a memory. The memory stores machine-readable instructions that, when executed by the processor, control the processor to execute any of the methods (A1) through (A8).

Changes may be made in the above methods and systems for producing a streak-suppressed MR image without departing from the scope hereof. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system for producing an MR image, which, as a matter of language, might be said to fall therebetween.

What is claimed is:

1. A method for producing a streak-suppressed magnetic resonance (MR) image of a subject comprising:
   generating an interference covariance matrix $\hat{R}$ from N coil images $I_j(x, y)$, $j=\{1, 2, \ldots, N\}$, each of the N coil images $I_j(x, y)$ corresponding to MR signals detected by a respective one of a phased array of N coils of an MRI scanner, at least some of the MR signals originating in a first plurality of voxels of the subject corresponding to an artifact-region of a coil image corrupted by an artifact, coordinates (x, y) corresponding to locations within a cross-sectional plane of the subject;
   for each of a plurality of subject-regions of the cross-sectional plane centered at a respective location (x, y), determining a coil weight vector $\overline{W}(x, y)$ from the interference covariance matrix $\hat{R}$; and
   generating the streak-suppressed MR image by combining a plurality of coil images using a weighted sum of the N coil images $I_j(x, y)$, each weight of the weighted sum being $W^*_j(x, y)$, a $j^{th}$ element of a complex conjugate of the coil weight vector $\overline{W}(x, y)$.

2. The method of claim 1, the first plurality of voxels being $Q_R$ in number, and, in the step of generating the interference covariance matrix:

the interference covariance matrix R being an N×N matrix, each matrix element $\hat{R}(j, k)$ being proportional to $$\frac{1}{(Q_R - 1)} \cdot \sum_{(x_c, y_c)} I_j(x_c, y_c) I_k^*(x_c, y_c),$$

where summation $\Sigma$ is over respective ranges of coordinates $x_c$ and $y_c$ corresponding to the first plurality of voxels, where $I^*_k$ denotes the complex conjugate of a coil image corresponding to the $k^{th}$ one of the N coils.

3. The method of claim 1, the second plurality of voxels being $Q_s$ in number, and, in the step of generating the signal correlation matrix $\hat{S}(x,y)$:

the signal correlation matrix $\hat{S}$ being an N×N matrix, a matrix element $\hat{S}^{(x,y)}(j, k)$ being proportional to $$\frac{1}{(Q_S - 1)} \cdot \sum_{(x_c, y_c)} I_j(x_c, y_c) I_k^*(x_c, y_c),$$

where summation $\Sigma$ is over respective ranges of coordinates $x_c$ and $y_c$ corresponding to the second plurality of voxels centered at voxel coordinate (x, y), where $I^*_k$ denotes the complex conjugate of a coil image corresponding to the $k^{th}$ one of the N coils.

4. The method of claim 1, I(x, y) denoting the streak-suppressed MR image, and in the step of generating the streak-suppressed MR image, $I(x, y) = \sum_{j=1}^{N} W^*_j(x, y) I_j(x, y)$.

5. The method of claim 1, further comprising, before determining the coil weight vector $\overline{W}(x, y)$ for at least one of the plurality of subject-regions: decreasing a condition number of the interference covariance matrix $\hat{R}$.

6. The method of claim 5, the interference covariance matrix $\hat{R}$ being an N×N matrix, decreasing the condition number comprising regularizing the interference covariance matrix $\hat{R}$ by adding thereto an N×N identity matrix multiplied by a scalar.

7. The method of claim 1, further comprising:
generating a signal correlation matrix $\hat{S}^{(x,y)}$ of the subject-region from the N coil images $I_j(x, y)$ corresponding to MR signals originating in a second plurality of voxels corresponding to the subject-region, and
determining a coil weight vector $\overline{W}(x, y)$ equal to an eigenvector of a matrix product $\hat{R}^{-1} \hat{S}^{(x,y)}$.

8. The method of claim 1, the phased array of N coils including M partitions of $N_M$ coils:
the step of generating the interference covariance matrix $\hat{R}$ comprising, for each of M partitions of the phased array of N coils, generating a respective interference covariance matrix $\hat{R}_m$, $m = \{1, 2, \ldots, M\}$;
the step of determining the coil weight vector comprising, for each of the M partitions, determining a respective a coil weight vector $\overline{W}_m(x, y)$ from the respective interference covariance matrix $\hat{R}_m$; and
in the step of generating the streak-suppressed MR image, I(x, y) denoting the streak-suppressed MR image, $W^*_{m,j}$ denoting a $j^{th}$ eigenvalue of the complex conjugate of the coil weight vector $\overline{W}_m(x, y)$, and in the step of generating the streak-suppressed MR image, $I(x, y) = \sum_{m=1}^{M} W^*_{m,j}(x, y) I_j(x, y)$.

9. A streak-artifact suppressor for producing a streak-suppressed magnetic resonance (MR) image of a subject, comprising:
a processor; and
a memory storing machine-readable instructions that, when executed by the processor, control the processor to:
generate an interference covariance matrix $\hat{R}$ from N coil images $I_j(x, y)$, $j = \{1, 2, \ldots, N\}$, each of the N coil images $I_j(x, y)$ corresponding to MR signals detected by a respective one of a phased array of N coils, at least some of the MR signals originating in a first plurality of voxels of the subject corresponding to an artifact-region of a coil image corrupted by an artifact, coordinates (x, y) corresponding to a location within a cross-sectional plane of the subject;
for each of a plurality of subject-regions of cross-sectional plane centered at a respective location (x, y), determine a coil weight vector $\overline{W}(x, y)$ from the interference covariance matrix $\hat{R}$;
generate the streak-suppressed MR image by combining a plurality of coil images using a weighted sum of the N coil images $I_j(x, y)$, each weight of the weighted sum being $W^*_j(x, y)$, a $j^{th}$ element of a complex conjugate of coil weight vector $\overline{W}(x, y)$.

10. The streak-artifact suppressor of claim 9, further comprising the phased array of N coils, the processor communicatively coupled to the phased array of N coils.

11. The streak-artifact suppressor of claim 9, the first plurality of voxels being $Q_R$ in number, the interference covariance matrix $\hat{R}$ being an N×N matrix, each matrix element $\hat{R}(j, k)$ being proportional to $$\frac{1}{(Q_R - 1)} \cdot \sum_{(x_c, y_c)} I_j(x_c, y_c) I_k^*(x_c, y_c),$$

where summation $\Sigma$ is over respective ranges of coordinates $x_c$ and $y_c$ corresponding to the first plurality of voxels, where $I^*_k$ denotes the complex conjugate of a coil image corresponding to the $k^{th}$ one of the N coils.

12. The streak-artifact suppressor of claim 9, the second plurality of voxels being Qs in number, the signal correlation matrix $\hat{S}$ being an N×N matrix, a matrix element $\hat{S}^{(x,y)}(j, k)$ being proportional to $$\frac{1}{(Q_S - 1)} \cdot \sum_{(x_c, y_c)} I_j(x_c, y_c) I_k^*(x_c, y_c),$$

where summation $\Sigma$ is over respective ranges of coordinates $x_c$ and $y_c$ corresponding to the second plurality of voxels centered at voxel coordinate (x, y), where $I^*_k$ denotes the complex conjugate of a coil image corresponding to the $k^{th}$ one of the N coils.

13. The streak-artifact suppressor of claim 9, I(x, y) denoting the streak-suppressed MR image, and in the step of generating the streak-suppressed MR image, $I(x, y) = \sum_{j=1}^{N} W^*_j(x, y) I_j(x, y)$.

14. The streak-artifact suppressor of claim 9, the memory further storing machine-readable instructions that, when executed by the processor, control the processor to:
generate a signal correlation matrix $\hat{S}^{(x,y)}$ of the subject-region from the N coil images $I_j(x, y)$ corresponding to MR signals originating in a second plurality of voxels corresponding to the subject-region, and determine a coil weight vector $\overline{W}(x, y)$ equal to an eigenvector of a matrix product $\hat{R}^{-1} \hat{S}^{(x,y)}$.

15. The streak-artifact suppressor of claim 9, the phased array of N coils including M partitions of $N_M$ coils, I(x, y) denoting the streak-suppressed MR image, the memory further storing machine-readable instructions that, when executed by the processor, control the processor to:

when generating the interference covariance matrix $\hat{R}$, for each of M partitions of the phased array of N coils, generate a respective interference covariance matrix $\hat{R}_m$, m={1, 2, ..., M};

when determining the coil weight vector, for each of the M partitions, determine a respective a coil weight vector $\overline{W}_m(x, y)$ from the respective interference covariance matrix $\hat{R}_m$; and generate the streak-suppressed MR image such that $I(x, y) = \sum_{m=1}^{M} \sum_{j=1}^{N_M} W^*_{m,j}(x, y) I_j(x, y)$, wherein $W^*_{m,j}$ denotes a $j^{th}$ eigenvalue of the complex conjugate of the coil weight vector $\overline{W}_m(x, y)$.

* * * * *